US005532177A

United States Patent [19]

Cathey

[11] Patent Number: 5,532,177

[45] Date of Patent: Jul. 2, 1996

[54] METHOD FOR FORMING ELECTRON EMITTERS

[75] Inventor: David A. Cathey, Boise, Id.

[73] Assignee: Micron Display Technology, Boise, Id.

[21] Appl. No.: 89,166

[22] Filed: Jul. 7, 1993

[51] Int. Cl.[6] .......... H01L 21/265

[52] U.S. Cl. .......... 437/40; 437/228; 437/974; 437/916; 148/DIG. 116; 148/DIG. 172

[58] Field of Search .......... 437/40, 904, 916, 437/974, 228; 148/DIG. 135, DIG. 172, DIG. 116; 156/643, 645

[56] References Cited

U.S. PATENT DOCUMENTS

| | | | |
|---|---|---|---|
| 3,665,241 | 5/1972 | Spindt et al. | 313/351 |
| 3,755,704 | 8/1973 | Spindt et al. | 313/309 |
| 3,812,559 | 5/1974 | Spindt et al. | 29/25.18 |
| 3,875,442 | 4/1975 | Wasa et al. | 313/193 |
| 3,894,332 | 7/1975 | Nathanson et al. | 156/649 |
| 3,970,887 | 7/1976 | Smith et al. | 313/309 |
| 4,874,981 | 10/1989 | Spindt et al. | 313/309 |
| 4,964,946 | 10/1990 | Gray et al. | 156/643 |
| 4,968,382 | 11/1990 | Jacobson et al. | 156/643 |
| 5,090,932 | 2/1992 | Dieumegard et al. | 437/93 |
| 5,201,992 | 4/1993 | Marcus et al. | 156/643 |
| 5,358,908 | 10/1994 | Reinberg et al. | 437/228 |
| 5,372,973 | 12/1994 | Doan et al. | 156/643 |
| 5,378,658 | 1/1995 | Toyoda et al. | 437/228 |

OTHER PUBLICATIONS

Marcus et al., "Automically Sharp Silicon and Metal Field Emitters", IEEE Transactions on Electron Devices, Oct. 1991, vol. 38, No. 10 pp. 2289–2293.

Hunt et al., "Structure and Electrical Characteristics of Silicon Field–Emission Microelectronic Devices", IEEE Transactions on Electron Devices, Oct. 1991, vol. 38, No. 10, pp. 2309–2313.

*Primary Examiner*—Tuan H. Nguyen
*Attorney, Agent, or Firm*—Lia Dennison

[57] ABSTRACT

Electron emitters and a method of fabricating emitters which have a concentration gradient of impurities, such that the highest concentration of impurities is at the apex of the emitters, and decreases toward the base of the emitters. The method comprises the steps of doping, patterning, etching, and oxidizing the substrate, thereby forming the emitters having impurity gradients.

8 Claims, 3 Drawing Sheets

METHOD FOR FORMING ELECTRON EMITTERS

FIELD OF THE INVENTION

This invention relates to field emitter technology, and more particularly, to electron emitters and method for forming them.

BACKGROUND OF THE INVENTION

Cathode ray tube (CRT) displays, such as those commonly used in desk-top computer screens, function as a result of a scanning electron beam from an electron gun, impinging on phosphors on a relatively distant screen. The electrons increase the energy level of the phosphors. The phosphors release energy impartedto them from the bombarding electrons, thereby emitting photons, which photons are transmitted through the glass screen of the display to the viewer.

Flat panel displays have become increasingly important in appliances requiring lightweight portable screens. Currently, such screens use electroluminescent, liquid crystal, or plasma technology. A promising technology is the use of a matrix addressable array of cold cathode emission devices to excite phosphor on a screen.

In U.S. Pat. No. 3,875,442, entitled "Display Panel," Wasa et. al. disclose a display panel comprising a transparent gas-tight envelope, two main planar electrodes which are arranged within the gas-tight envelope parallel with each other, and a cathodeluminescent panel. One of the two main electrodes is a cold cathode, and the other is a low potential anode, gate, or grid. The cathode luminescent panel may consist of a transparent glass plate, a transparent electrode formed on the transparent glass plate, and a phosphor layer coated on the transparent electrode. The phosphor layer is made of, for example, zinc oxide which can be excited with low energy electrons.

Spindt, et. al. discuss field emission cathode structures in U.S. Pat. Nos. 3,665,241, and 3,755,704, and 3,812,559, and 4,874,981. To produce the desired field emission, a potential source is provided with its positive terminal connected to the gate, or grid, and its negative terminal connected to the emitter electrode (cathode conductor substrate). The potential source may be made variable for the purpose of controlling the electron emission current. Upon application of a potential between the electrodes, an electric field is established between the emitter tips and the grid, thus causing electrons to be emitted from the cathode tips through the holes in the grid electrode.

An array of points in registry with holes in grids are adaptable to the production of gate emission sources subdivided into areas containing one or more tips from which areas of emission can be drawn separately by the application of the appropriate potentials thereto.

There are several methods by which to form the electron emission tips. Examples of such methods are presented in U.S. Pat. No. 3,970,887 entitled, "Micro-structure Field Emission Electron Source."

SUMMARY OF THE INVENTION

The performance of a field emission display is a function of a number of factors, including emitter tip or edge sharpness.

In the process of the present invention, a dopant material which effects the oxidation rate or the etch rate of silicon, is diffused into a silicon substrate or film. "Stalks" or "pillars" are then etched, and the dopant differential is used to produce a sharpened tip. Alternatively, "fins" or "hedges" may be etched, and the dopant differential used to produce a sharpened edge.

One of the advantages of the present invention is the manufacturing control, and available process window for fabricating emitters, particularly if a high aspect ratio is desired. Another advantage of the present invention is its scalability to large areas.

BRIEF DESCRIPTION OF THE DRAWINGS

The present invention will be better understood from reading the following description of nonlimitative embodiments, with reference to the attached drawings, wherein below.

DETAILED DESCRIPTION OF THE INVENTION

Figure 1:
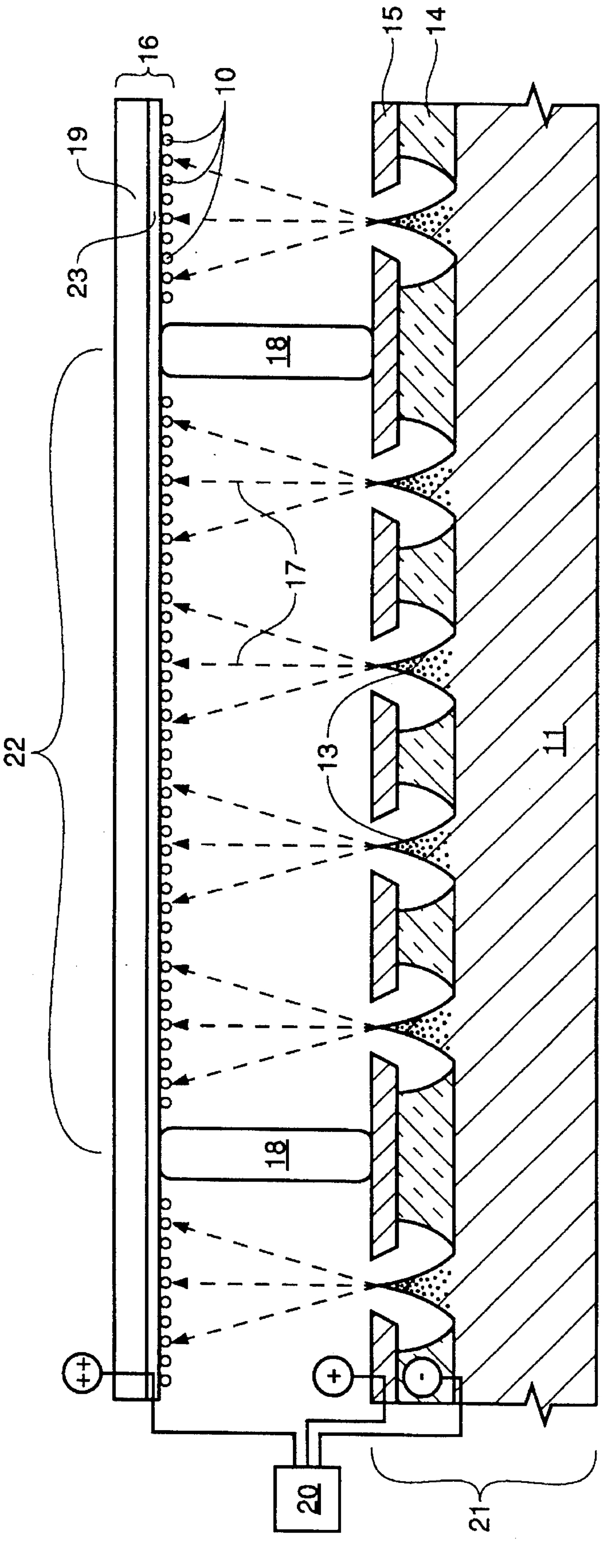
FIG. 1 is a schematic cross-section of a field emission device in which the emitter tips or edges formed from the process of the present invention can be used.

Referring to FIG. 1, a field emission display employing a pixel 22 is depicted. In this embodiment the cold cathode emitter tip 13 of the present invention is depicted as part of the pixel 22. In an alternative embodiment, the emitter 13 is in the shape of an elongated wedge, the apex of such a wedge being referred to as a "knife edge" or "blade."

The schematic cross-sections for the alternative embodiment are substantially similar to those of the preferred embodiment in which the emitters 13 are tips. From a top view (not shown) the elongated portion of the wedge would be more apparent.

FIG. 1 is merely illustrative of the many applications for which the emitter 13 of the present invention can be used. The present invention is described herein with respect to field emitter displays, but one having ordinary skill in the art will realize that it is equally applicable to any other device or structure employing a micro-machined point, edge, or blade, such as, but not limited, to a stylus, probe tip, fastener, or fine needle.

The substrate 11 can be comprised of glass, for example, or any of a variety of other suitable materials, onto which a conductive or semiconductive material layer, such as doped poly crystalline silicon can be deposited. In the preferred embodiment, single crystal silicon serves as a substrate 11, from which the emitters 13 are directly formed. Other substrates may also be used including, but not limited to macrograin polysilicon and monocrystalline silicon; the selection of which may depend on cost and availability.

If an insulative film or substrate is used with the process of the present invention, in lieu of the conductive or semiconductive film or substrate 11, the micro-machined emitter 13 should be coated with a conductive or semiconductive material, prior to doping.

At a field emission site, a micro-cathode 13 (also referred to herein as an emitter) has been constructed in the substrate 11. The micro-cathode 13 is a protuberance which may have a variety of shapes, such as pyramidal, conical, wedge, or other geometry which has a fine micro-point, edge, or blade for the emission of electrons. The micro-tip 13 has an apex and a base. The aspect ratio (i.e., height to base width ratio) of the emitters 13 is preferably greater than 1:1. Hence, the preferred emitters 13 have a tall, narrow appearance.

The emitter 13 of the present invention has an impurity concentration gradient, indicated by the shaded area 13*a*) in which the concentration is higher at the apex and decreases towards the base.

Surrounding the micro-cathode 13, is an extraction grid or gate structure 15. When a voltage differential, through source 20, is applied between the cathode 13 and the gate 15, an electron stream 17 is emitted toward a phosphor coated screen 16. The screen 16 functions as the anode. The electron stream 17 tends to be divergent, becoming wider at greater distances from the tip of cathode 13.

The electron emitter 13 is integral with the semiconductor substrate 11, and serves as a cathode conductor. Gate 15 serves as a grid structure for its respective cathode 13. A dielectric insulating layer 14 is deposited on the substrate 11. However, a conductive cathode layer (not shown) may also be disposed between the insulating layer 14 and the substrate 11, depending upon the material selected for the substrate 11. The insulator 14 also has an opening at the field emission site location.

The process of the present invention, by which the emitter 13 having the impurity concentration gradient is fabricated, is described below.

Figure 2:
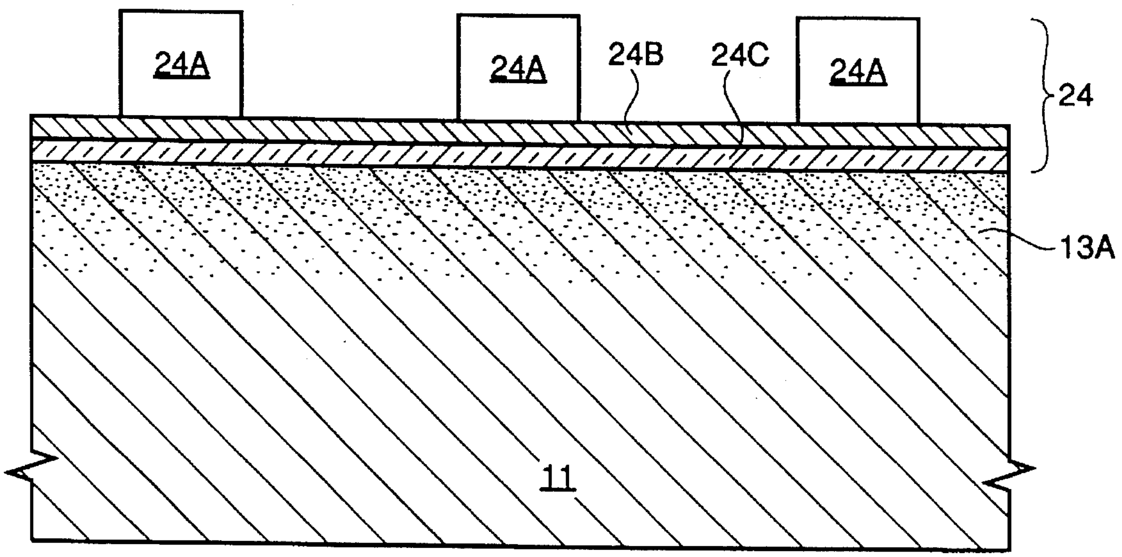
FIG. 2 is a schematic cross-section of the doped substrate of the present invention superjacent to which is a mask, in this embodiment the mask comprises several layers.
Figure 3:
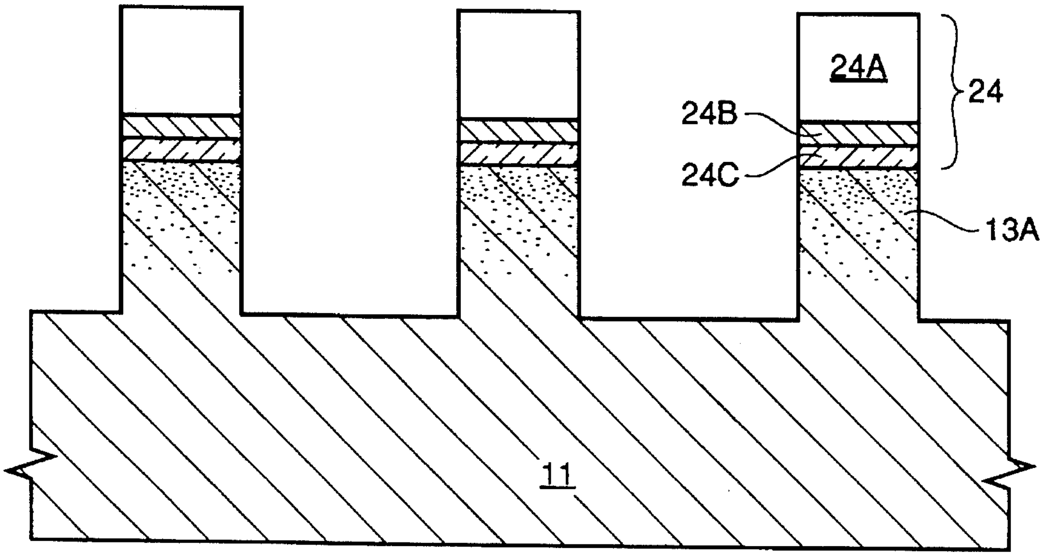
FIG. 3 is a schematic cross-section of the substrate of FIG. 2, after the substrate has been patterned and etched according to the process of the present invention.

FIG. 2 shows the substrate or film 11 which is used to fabricate a field emitter 13. The substrate 11 is preferably single crystal silicon. An impurity material 13*a* is introduced into the film 11 in such a manner so as to create a concentration gradient from the top of the substrate surface 11 which decreases with depth down into the film or substrate 11. Preferably, the impurity 13*a* is from the group including, but not limited to boron, phosphorus, and arsenic.

The substrate 11 can be doped using a variety of available methods. The impurities 13*a* can be obtained from a solid source diffusion disc or gas or vapor feed source, such as POCl, or from spin on dopant with subsequent heat treatment or implantation or CVD film deposition with increasing dopant component in the feed stream, through time of deposition, either intermittently or continuously.

In the case of a CVD or epitaxially grown film, it is possible to introduce an impurity which decreases throughout the deposition and serves as a component for retarding the consumptive process subsequently employed in the process of the present invention. An example is the combination of a silicon film or substrate 11, doped with a boron impurity 13*a*, and etched with a ethylene diamine pyrocatechol (EDP) etchant, where the EDP is employed after anisotropically etching pillars or fins from material 11.

In the preferred embodiment, the substrate 11 is silicon. After doping, the film or substrate 11 is then patterned, preferably with a resist/silicon nitride/silicon oxide sandwich etch mask 24 and dry etched. Other types of materials can be used to form the mask 24, as long as they provide the necessary selectivity to the substrate 11. The silicon nitride/silicon oxide sandwich has been selected due to its tendency to assist in controlling the lateral consumption of silicon during thermal oxidation, which is well known in semiconductor LOCOS processing.

The structure of FIG. 2 is then etched, preferably using a reactive ion, crystallographic etch, or other etch method well known in the art. Preferably the etch is substantially anisotropic, i.e., having undercutting which is reduced and controlled, thereby forming "pillars" in the substrate 11, which "pillars" 13, will be the sites of the emitter tips 13 of the present invention.

Figure 4:
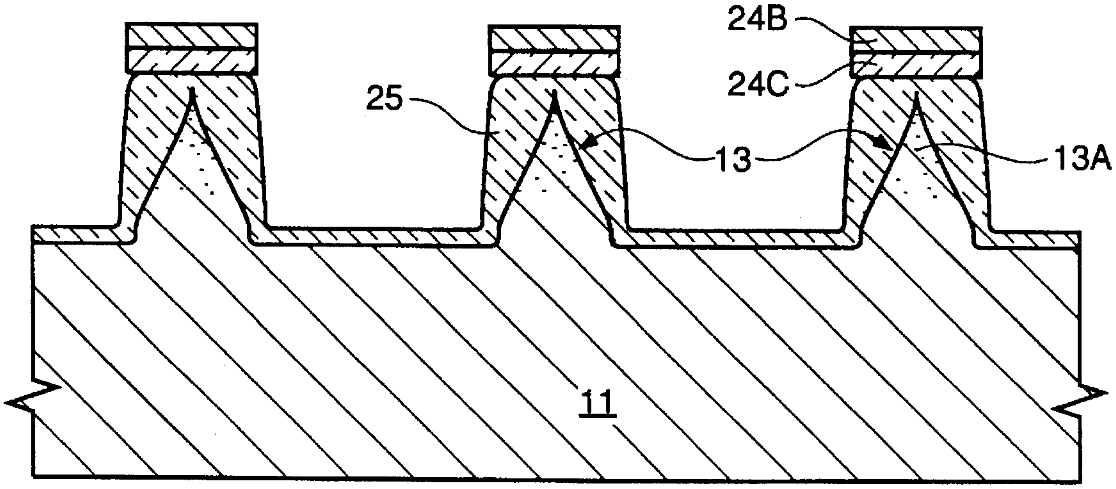
FIG. 4 is a schematic cross-section of the substrate of FIG. 3, after the tips or edges have been formed, according to the process of the present invention.

FIG. 4 illustrates the substrate 11 having emitter tips 13 formed therein. The resist portion 24*a* of the mask 24 has been removed. An oxidation is then performed, wherein an oxide layer 25 is disposed about the tip 13, and subsequently removed.

Alternatively, an etch, is performed, the rate of which is dependent upon (i.e., function of) the concentration of the contaminants (impurities exposed to a consumptive process, whereby the rate or degree of consumption is a function of the impurity concentration, such as the thermal oxidation of silicon which has been doped with phosphorus 13*a*).

The etch, or oxidation, proceeds at a faster rate in areas having higher concentration of impurities. Hence, the emitters 13 are etched faster at the apex, where there is an increased concentration of impurities 13*a*, and slower at the base, where there is a decrease in the concentration.

The etch is preferably non-directional in nature, removing material of a selected purity level in both horizontal and vertical directions, thereby creating an undercut. The amount of undercut is related to the impurity concentration 13*a*.

Figure 5:
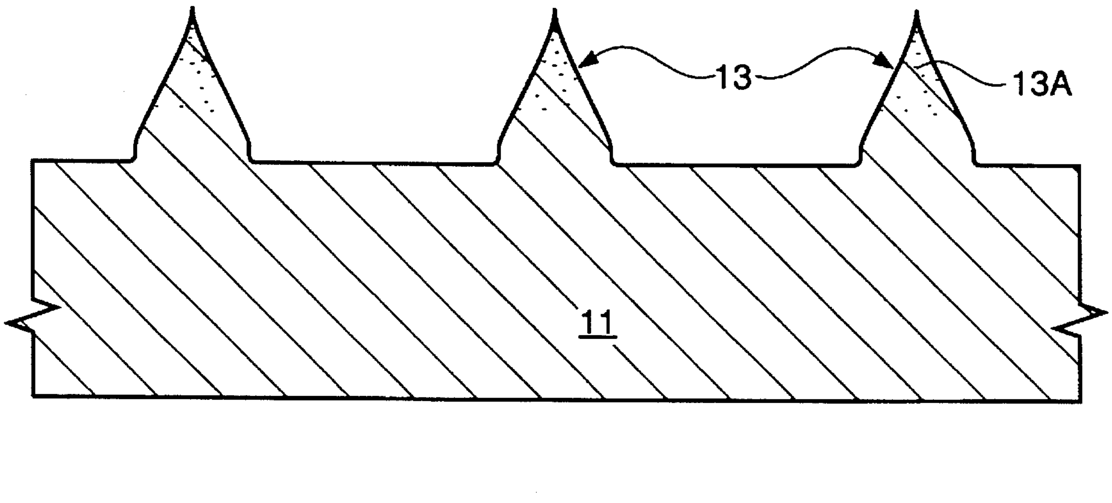
FIG. 5 is a schematic cross-section of the tips or edges of FIG. 4, after the nitride and oxide layers of the mask have been removed.

FIG. 5 shows the emitters 13 following the removal of the nitride 24*b* and oxide 24*c* layers, preferably by a selective wet stripping process. An example of such a stripping process involves 1:100 solution of hydrofluoric acid (HF)/water at 20° C., followed by a water rinse. Next is a boiling phosphoric acid ($H_3PO_4$)/water solution at 140° C., followed by a water rinse, and 1:4 hydrofluoric acid (HF)/water solution at 20° C. The emitters 13 of the present invention are thereby exposed.

All of the U.S. Patents cited herein are hereby incorporated by reference herein as if set forth in their entirety.

While the particular process as herein shown and disclosed in detail is fully capable of obtaining the objects and advantages herein before stated, it is to be understood that it is merely illustrative of the presently preferred embodiments of the invention and that no limitations are intended to the details of construction or design herein shown other than as described in the appended claims. For example, one having ordinary skill in the art will realize that the emitters can be used in a number of different devices, including but not limited to field emission devices, cold cathode electron emission devices, micro-tip cold cathode vacuum triodes.

What is claimed is:

1. A process for fabricating emitters, said process comprising the following steps of:

forming a dopant concentration gradient of a dopant in a substrate, wherein said substrate has a surface and said dopant substantially covers said surface;

patterning said substrate;

selectively removing portions of said substrate, thereby defining emitters; and sharpening said emitters, wherein said sharpening comprises oxidation, said emitters oxidize at a rate which is a function of said dopant concentration gradient.

2. The process according to claim 1, wherein said patterning employs a photoresist/silicon nitride/silicon oxide sandwich.

3. The process according to claim 2, wherein said dopant concentration gradient decreases with depth into said substrate.

4. The process according to claim 2, wherein said dopant concentration gradient increases with depth into said substrate.

5. A method for manufacturing emitters, said method comprising the following steps of:

selectively removing portions of a substrate, thereby forming emitters, said substrate comprising a surface and a dopant comprising at least one of arsenic, phosphorous, and boron, said dopant substantially covers said surface and forms a concentration gradient in said substrate, said selective removal comprising etching, wherein said gradient decreases with depth into said substrate, said etching having a rate which decreases as the gradient decreases;

patterning said substrate, said pattern being formed with a mask, said mask comprising a photoresist/silicon nitride/silicon oxide sandwich; and oxidizing said substrate, said substrate comprising silicon.

6. The method according to claim 5, wherein said emitters are incorporated in an electron emission device.

7. A process for fabricating an emitter, said process comprising the following steps of:

providing a substrate having a substantially continuous face and a depth extending away from said face;

applying a dopant substantially continuously across said face to form a dopant concentration gradient within said substrate progressively extending away from said face along said depth;

patterning said substrate by positioning a mask over said face, thereby partitioning said face into an unmasked portion and a masked portion;

selectively removing said substrate underlying said unmasked portion of said face, thereby retaining a substrate protuberance underlying said masked portion of said face, wherein said substrate protuberance has a base and an apex of substantially the same width, said width corresponding to the width of said mask; and sharpening said apex of said protuberance into a point or an edge by removing a portion of said apex, thereby defining an emitter, wherein said sharpening comprises oxidizing a portion of said protuberance and removing said oxidized portion.

8. The process according to claim 7, wherein said masks comprises a photoresist/silicon nitride/silicon oxide sandwich.

* * * * *